United States Patent
Yu et al.

(10) Patent No.: US 8,331,487 B2
(45) Date of Patent: Dec. 11, 2012

(54) ANALOG SIGNAL PROCESSOR FOR NONLINEAR PREDISTORTION OF RADIO-FREQUENCY SIGNALS

(75) Inventors: Qian Yu, Santa Clara, CA (US); Frédéric Roger, Santa Clara, CA (US); Adric Q. Broadwell, San Francisco, CA (US); Olivier Charlon, San Francisco, CA (US)

(73) Assignee: Scintera Networks, Inc., Sunnyvale, CA (US)

(*) Notice: Subject to any disclaimer, the term of this patent is extended or adjusted under 35 U.S.C. 154(b) by 156 days.

(21) Appl. No.: 12/939,067

(22) Filed: Nov. 3, 2010

(65) Prior Publication Data
US 2012/0106600 A1    May 3, 2012

(51) Int. Cl.
*H04K 1/02* (2006.01)
*H04L 25/03* (2006.01)
*H04L 25/49* (2006.01)

(52) U.S. Cl. ..... 375/297; 375/296; 398/193; 455/114.2; 455/114.3

(58) Field of Classification Search ............... 455/114.2, 455/114.3; 375/296–297; 398/193
See application file for complete search history.

(56) References Cited

U.S. PATENT DOCUMENTS

| | | | |
|---|---|---|---|
| 7,804,359 B1 * | 9/2010 | Cova | 330/149 |
| 8,121,560 B1 * | 2/2012 | Anaraki et al. | 455/114.3 |

* cited by examiner

*Primary Examiner* — Curtis Odom
(74) *Attorney, Agent, or Firm* — Hogan Lovells US LLP

(57) ABSTRACT

RF predistortion apparatus for making linear the output signal of non-linear components such as RF power amplifiers. The apparatus comprises an RF input line for carrying an RF signal connected to an envelope detector for finding the envelope of the RF signal, a power detector for finding the power of the RF signal and a quadrature modulator. The apparatus also comprises a coefficient vector input line for carrying an input signal that carries one or more coefficients to a digitally controlled analog subsystem (DCAS). The DCAS having circuitry for processing both the output of the envelope detector and the output of the power detector by selecting one or more coefficients from the coefficient vector input line for generating a weighted summation of the power of the RF signal and a weighted summation of the envelope voltage of the RF signal that are output to the quadrature modulator. The quadrature modulator has circuitry for mixing the RF input signal with the output of the DCAS to generate a signal for predistorting the RF input signal feeding the power amplifier.

22 Claims, 9 Drawing Sheets

Analog Signal Processor for Nonlinear Predistortion of Radio-Frequency Signals

FIELD OF THE INVENTION

This invention relates to a predistortion apparatus for nonlinear components, which can be used to make linear the output of a radio-frequency (RF) power amplifier (PA), as well as various component circuitry for implementing said pre-distortion apparatus.

BACKGROUND OF THE INVENTION

Telecommunication systems are composed of various geographically separated nodes having one or more signals being transmitted and received between nodes. For example, a cellular telephone system is composed of towers where each has a base station that transmits and receives RF signals to one or more cellular telephone transceivers. Signals transmitted over a radio link may be attenuated due to such factors as propagation loss and multipath fading. Since the amplitude of the signal is attenuated during transmission between nodes, communication signals typically require power amplifiers (PAs) to compensate for these losses.

It is desired that a PA produce a linear output so that the amplifier accurately reproduces the signal present at the input in both amplitude and phase. Therefore, an ideal PA will pass the input signal through to the output undistorted but enlarged with a gain set by the user and with no delay, independent of the output impedance of the input signal source. In addition the ideal PA will be able to drive any load; i.e., supply any current. In reality, however, PAs are not ideal over their entire operating range. A PA that does not have a linear input/output relationship will cause unwanted amplitude variations of the output signal (e.g., spreading unwanted harmonics onto adjacent radio frequencies), which may interfere with other radio channels. Third-generation (3G) cellular wireless communication systems, for example, have a need for high linearity at the PA output to achieve a high adjacent channel leakage ratio (ACLR) and a low error vector magnitude (EVM).

To suppress unwanted PA nonlinearity, predistortion circuits have been made and used. A predistortion circuit models the PA's gain and phase characteristics and provides an output signal, when combined with the PA's input signal, produces an overall system that is more linear (in reference to the unpredistorted input signal). Thus, distortion or predistortion is purposely introduced into the input signal of the PA with the goal of correcting any non-linearity in the output signal of the PA. In some implementation of the pre-distortion circuit, there is another goal, which is to provide a memoryless output signal. One example of a predistortion apparatus that can be used as a linearizer for a PA for RF applications is disclosed in U.S. patent application Ser. No. 11/484,008, entitled "Pre-Distortion Apparatus," filed on Jul. 7, 2006.

In addition to causing a PA to provide a linear output signal, another advantage of using a pre-distortion circuit is added cost savings. As power increases to its maximum rated output, a PA without any predistortion tends to have a non-linear output that becomes progressively worse as the maximum rating is approached. Thus, predistortion obtains more usable power from the PA, without resorting to a larger and more expensive device.

Various pre-distortion techniques have been described in the prior art. Some devices use digital predistortion logic circuits which use data stored in a look-up table containing a "mirror image" of the characteristics of the measured signal. Alternatively, these "mirror image" characteristics may be preprogrammed into predistortion components operating in the RF circuitry in a technique known as "analog feed-forward." Yet another predistortion technique is known as "polynomial-based" digital predistortion (DPD), which entails digitally predistorting a signal at baseband using polynomial basis functions. With the appropriate feedback, time-varying PA characteristics can be optimally adjusted using DPD.

Although DPD is widely used today, DPD solutions suffer from the problem of high power consumption and high cost because nonlinear predistortion expands signal bandwidth by a factor of five or more. This problem is a critical issue in a commercial cellular wireless system governed by in-band and out-of-band specifications for base stations communicating with mobile telephones and for repeaters used to extend base station coverage. In base station and repeater applications, it is often too expensive to take the conventional approach, which requires RF-to-digital down-conversion and digital-to-RF up-conversion before and after DPD, respectively. Another problem with DPD is in its application to medium-to-low power (e.g., 10 W) PAs, such as, for example, PAs used in beam-forming antenna arrays. In antenna arrays, using DPD on each PA in the array can severely limit the overall energy efficiency of the entire system. Power usage and unit cost become a significant concern for companies deploying cellular telephone networks with millions of base stations and repeaters.

The present disclosure describes a novel linear power amplifier providing superior performance by using an analog RF predistortion block for distortion of RF signals.

SUMMARY OF THE INVENTION

The present disclosure describes novel apparatuses for making linear the output signal of non-linear components such as RF power amplifiers, as well as various component circuitry for implementing said apparatuses.

One aspect of the inventions provides for an RF predistortion apparatus comprising: an RF input line for carrying an RF signal; a coefficient vector input bus for carrying a coefficient vector comprising a plurality of coefficient signals each representing a coefficient; an RF predistortion processor, comprising: (a) a digitally controlled analog subsystem (DCAS) receiving an envelope signal representing a signal envelope of the RF signal and the coefficient vector; the DCAS generating first and second weight signals, $V_p(t)$ and $V_q(t)$, each representing a polynomial function of the RF input signal; and (b) a quadrature modulator coupled to the RF signal line and the DCAS to receive the RF input signal and the first and second weight signals, the quadrature modulator providing a predistortion signal representing a sum of in-phase and quadrature signals derived from the RF input signal, respectively weighted by the first and second weight signals; and an RF delay element coupled to the RF input line to provide a delayed RF input signal; and an RF coupler coupling the predistortion signal and the delayed RF input signal to provide a predistorted input signal to a power amplifier.

A further aspect of the invention provides for a telecommunications system comprising: an RF receiving antenna, an RF linear power amplifier, an RF receiving mixer, an RF receiving oscillator and an RF receiver; the RF linear power amplifier further comprising: an RF input line for carrying an RF input signal connected to a power amplifier, a quadrature modulator, an envelop detector and a power detector; a digitally controlled analog subsystem (DCAS) connected to an output of the envelop detector, an output of the power detector, and an output of a coefficient vector generator wherein the DCAS has circuitry for processing the signals from the envelop detector, power detector and coefficient generator and wherein said circuitry selects one or more of coefficients from the coefficient vector generator and generates a weighted summation of the signals from the power detector and the envelop detector that are output to the quadrature modulator; and wherein the quadrature modulator has circuitry for mixing the DCAS output signals with the RF input signal to generate a signal output by the quadrature modulator that is connected to the RF input line for predistorting the RF input signal feeding the power amplifier.

Yet a further aspect of the invention provides for a linear power amplifier apparatus comprising: an RF input line for carrying an RF input signal connected to a power amplifier, a quadrature modulator, an envelop detector and a power detector; a digitally controlled analog subsystem (DCAS) connected to an output of the envelop detector, an output of the power detector, and an output of a coefficient vector generator wherein the DCAS has circuitry for processing the signals from the envelop detector, power detector and coefficient generator and wherein said circuitry selects one or more of coefficients from the coefficient vector generator and generates a weighted summation of the signals from the power detector and the envelop detector that are output to the quadrature modulator; and wherein the quadrature modulator has circuitry for mixing the DCAS output signals with the RF input signal to generate a signal output by the quadrature modulator that is connected to the RF input line for predistorting the RF input signal feeding the power amplifier.

BRIEF DESCRIPTION OF THE FIGURES

In these figures and in the detailed description below, like elements are assigned like reference numerals.

DETAILED DESCRIPTION

Figure 1:
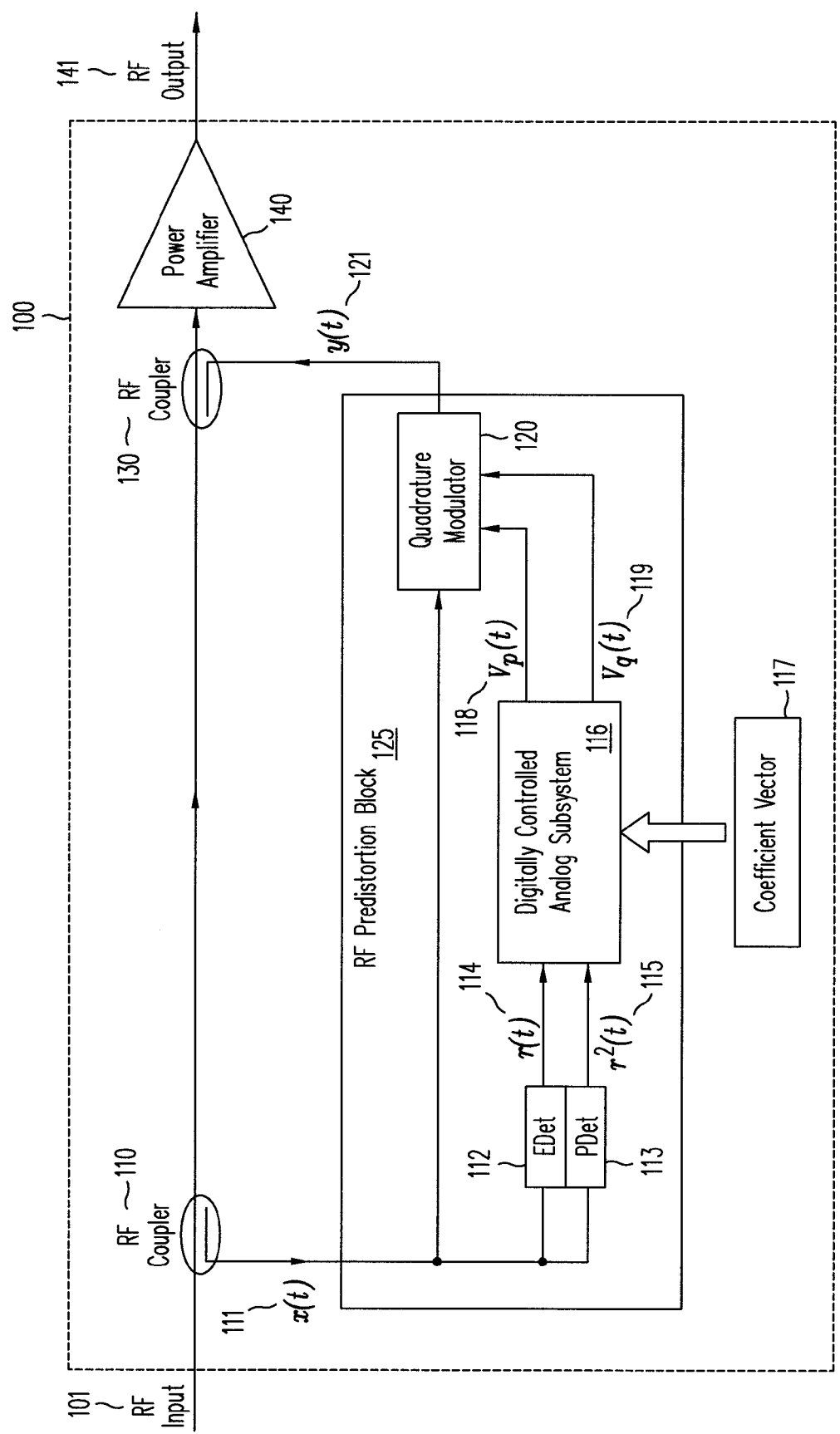
FIG. 1 shows a linear power amplifier with an analog RF predistortion block.

In a first embodiment of a linear power amplifier, a linear PA circuit 100 is shown in FIG. 1. At RF Input signal 101 is injected into the circuit. An RF coupler 110 provides incoming RF input signal 101 to RF predistortion block 125. For illustrative purpose, RF input signal 101 may be a time-varying signal, expressed as x(t) 111, which may have the form shown in Equ. 1, where r(t) is the envelope of the signal.

$$x(t) = r(t)\cos[2\pi ft + \phi(t)] \quad \text{Equ. 1}$$

RF distribution block 125 comprises envelop detector (EDet) 112, power detector (PDet) 113, digitally controlled analog subsystem (DCAS) 116 and quadrature modulator 120. RF predistortion block 125 may be constructed as a single integrated circuit or as multiple integrated circuits or by discrete components, as desired.

The envelope r(t) of x(t) 111, is output by envelop detector 112 as r(t) 114. The power of x(t) 111 is output by power detector 113 as $r^2(t)$ 115. The envelop and power of x(t) 111, r(t) 114 and $r^2(t)$ 115, respectively, are input to DCAS 116. Using weights from coefficient vector generator 117, DCAS 116 generates polynomials of r(t) 114 and $r^2(t)$ 115. Coefficient vector generator 117 may create polynomial coefficients for DCAS 116 from a stored memory or by using an algorithm.

The polynomials are represented by DCAS 116 as voltages $V_p(t)$ 118 and $V_q(t)$ 119. Ignoring various nonidealities in the analog circuit implementation, these voltages may be expressed as shown in Equ. 2 and Equ. 3.

$$V_p(t) = \sum_{m=0}^{M-1}\sum_{k=1}^{K} a_{mk} r^m(t - \tau_k) \quad \text{Equ. 2}$$

$$V_q(t) = \sum_{m=0}^{M-1}\sum_{k=1}^{K} b_{mk} r^m(t - \tau_k) \quad \text{Equ. 3}$$

In Equ. 2 and Equ. 3, $a_{mk}$ and $b_{mk}$ are polynomial coefficients and $\tau_k$ are memory delays. Polynomial coefficients $a_{mk}$ and $b_{mk}$ are provided by coefficient vector generator 117. The voltages $V_p(t)$ 118 and $V_q(t)$ 119 are sent to quadrature modulator 120, which also receives RF input signal x(t) 111. Quadrature modulator 120 outputs a signal y(t) 121. The signal y(t) 121 may be expressed as shown in Equ. 4.

$$y(t) = V_p(t)r(t)\cos[2\pi ft + \phi(t)] + V_q(t)r(t)\sin[2\pi ft + \phi(t)] \quad \text{Equ. 4}$$

An RF coupler 130 couples the signal y(t) 121 into the input signal for PA 140 thus serving to predistort the original RF signal coming from RF input 101. In this way, linearly amplified power is output from linear power amplifier 100 at RF output 141.

Figure 2:
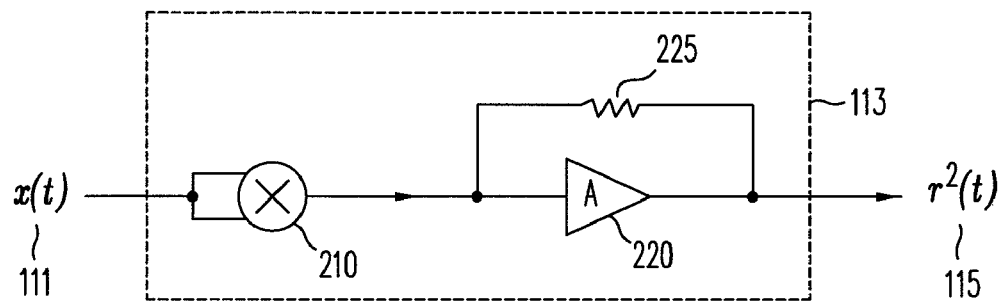
FIG. 2 shows the power detector described in FIG. 1.

FIG. 2 describes one embodiment of the power detector 113 introduced in reference to FIG. 1. Power detector 113 is a current-mode Gilbert multiplier 210 followed by a trans-impedance amplifier 220 shown with a loop that includes resistor 225.

Figure 3:
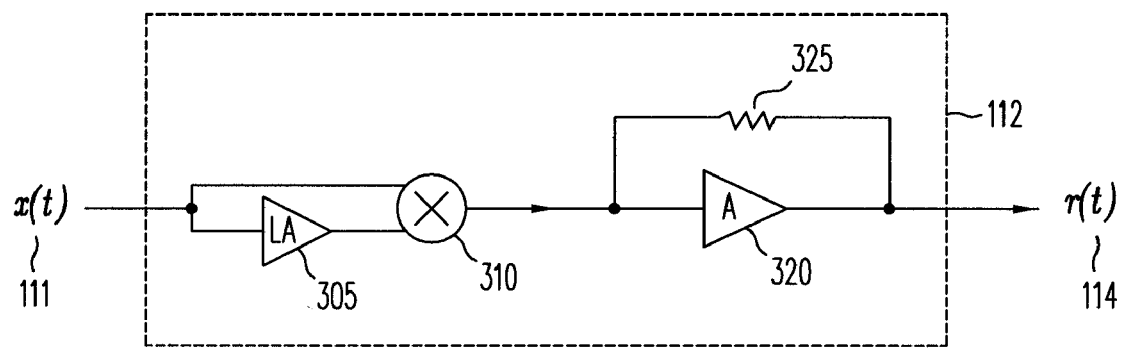
FIG. 3 shows the envelop detector described in FIG. 1.

FIG. 3 describes one embodiment of the envelop detector 112 introduced in reference to FIG. 1. It is difficult to construct high-quality envelop detectors using diodes in standard CMOS because of the lack of diodes that can operate at RF frequencies such as, for example, 2.5 GHz. Other components are, therefore, typically better suited to certain RF applications. In one embodiment an envelop detector 112 comprises a limiting amplifier 305 preferably providing a bandwidth higher than the RF frequency of x(t) 111 and a small-signal gain of no less than 12 dB. Additional components of envelop detector 112 include a current-mode Gilbert multiplier 310 followed by a trans-impedance amplifier 320 shown with a loop that includes resistor 325.

An alternative technique for envelop detection is a power detector 113 followed by an analog square rooting circuit, which will operate with signals having bandwidths typically between 10 MHz to 50 MHz.

Figure 4:
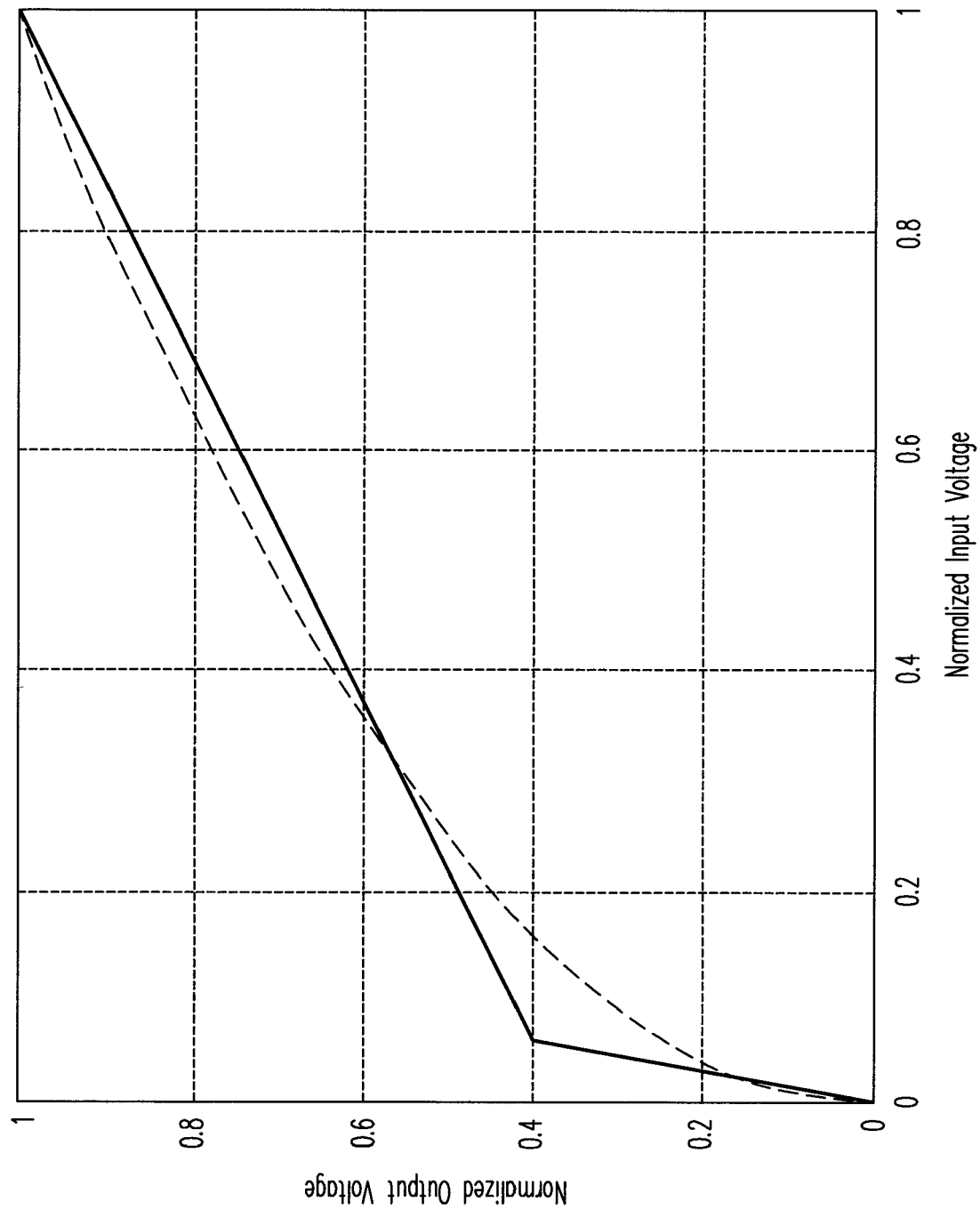
FIG. 4 shows the voltage response of a soft limiting amplifier that may be used in the RF predistortion block described in FIG. 1.

In some embodiments an envelop detector is not required for the predistortion of many PAs. In those embodiments where an envelop detector is not required, an approximate envelop detector followed by a soft limiting amplifier (SLA) may be used. The SLA has a finite small-signal gain of about 15 dB. For large signals, the SLA has a soft saturation behavior roughly comparable to a square-root function. FIG. 4 shows the SLA's nonlinear response in a piecewise linear approximation. Referring to FIG. 4, the solid line is an example of the nonlinear voltage response of an SLA, and the dashed line is the square-root of the nonlinear voltage response.

Figure 5:
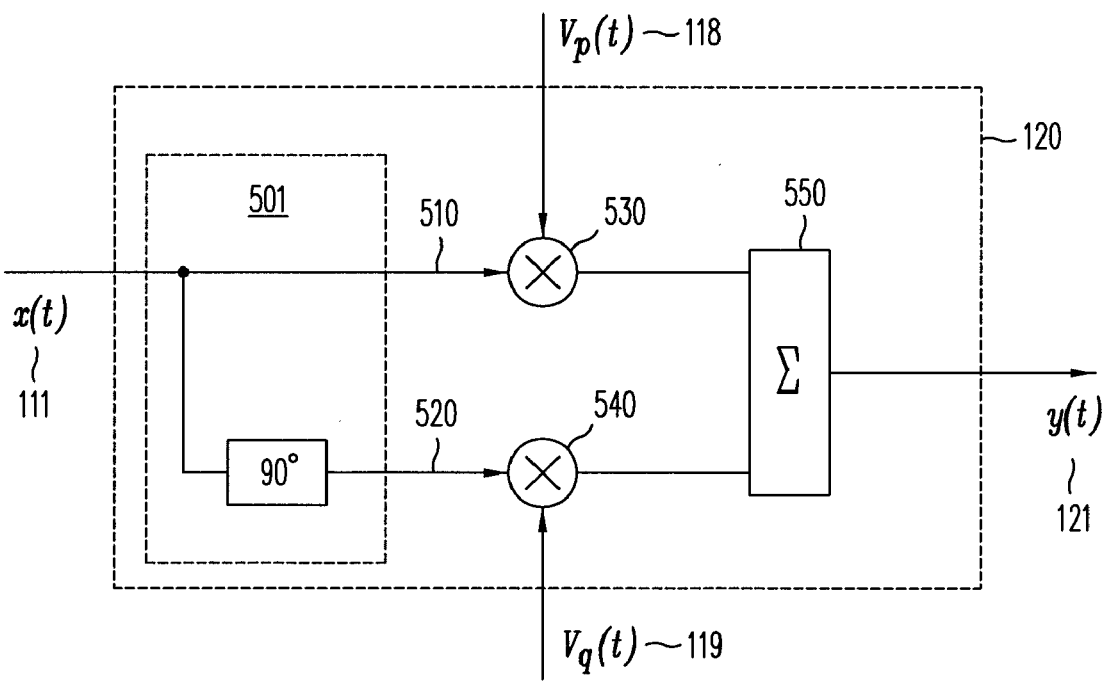
FIG. 5 shows the quadrature modulator described in FIG. 1.

FIG. 5 describes one embodiment of the quadrature modulator 120 shown in FIG. 1. As is shown in FIGS. 1 and 5, the output voltages of the DCAS 116, $V_p(t)$ and $V_q(t)$, are the input signals to quadrature modulator 120. In FIG. 5, input signal x(t) 111 is rotated in rotator 501 to provide in-phase signal 510 and quadrature signal 520, namely $r(t)\cos(2\pi ft+\phi(t))$ and $r(t)\sin(2\pi ft+\phi(t))$ respectively. The in-phase and quadrature signals are then respectively multiplied using multipliers 530 and 540 by $V_p(t)$ and $V_q(t)$ and added in summer 550 to provide output signal y(t) 121.

If $V_p(t)$ and $V_q(t)$ have non-zero DC offsets, the quadrature modulator 120 output, y(t) 121, may have a leakage of the RF input signal. Depending on the polynomial weights output by coefficient vector generator 117, any leakage will likely change the average input power of PA 140. The DC offsets of $V_p(t)$ and $V_q(t)$ can be cancelled by either one of two techniques known to those working in the field. The first technique uses a negative feedback loop to cancel the DC offsets. A second technique uses capacitive coupling.

Figure 6:
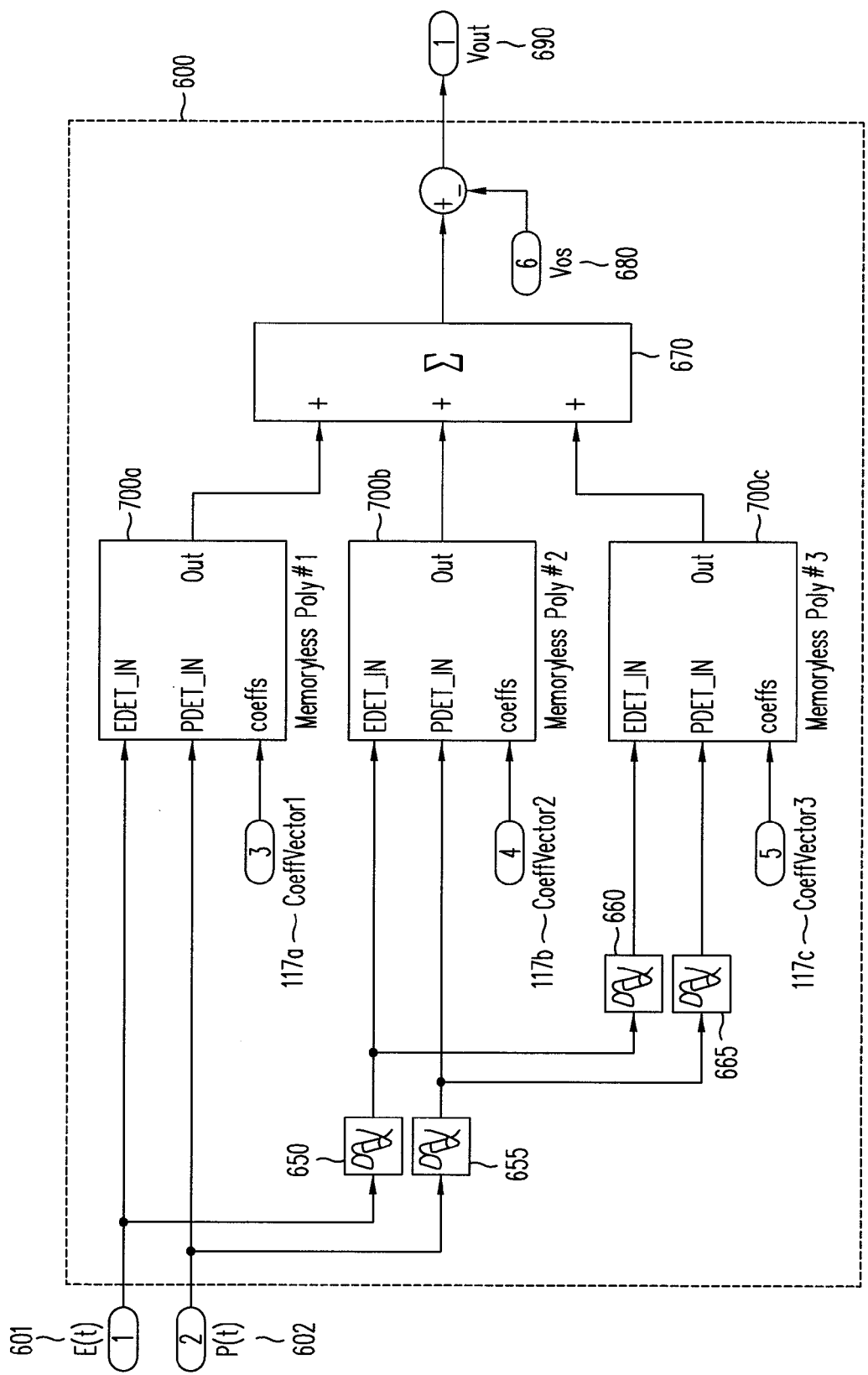
FIG. 6 shows a digitally controlled analog subsystem of the RF predistortion block in FIG. 1.

FIG. 6 further describes DCAS 116 introduced in reference to FIG. 1. Block 600 represents an example of a polynomial generator in DCAS 116 for generating a polynomial with a non-delayed and two delayed terms. As shown in FIG. 6, the memory delays are 0, π, and 2π. Delay elements 650, 655, 660 and 665 are analog delay components which may be implemented as first-order RC filters. As shown in FIG. 6, these delay elements delay the envelope and power signals E(t) 601 and P(t) 602, corresponding to envelope signal r(t) 114 and $r^2(t)$ 115, for example. Alternatively, these delay components may be implemented as track-and-hold circuits where long delays can be achieved by cascading multiple track-and-hold stages. Memoryless polynomial circuits 700a, 700b and 700c process the input signals E(t) 601, P(t) 602 and from coefficient vectors 117a, 117b and 117c, respectively. The output signals of circuits 700a, 700b and 700c are sent to summer 670 and the resulting sum is output value $V_{out}$ 690 (i.e., generated $V_p(t)$ or $V_q(t)$), after subtracted any detected offset value $V_{os}$ 680. Under the assumption that ideal envelop detection is performed, E(t) 601 and P(t) 602 can be expressed as shown in Equ. 5 and Equ. 6.

$$P(t)=r^2(t) \qquad \text{Equ. 5}$$

$$E(t)=\sqrt{P(t)} \qquad \text{Equ. 6}$$

Figure 7:
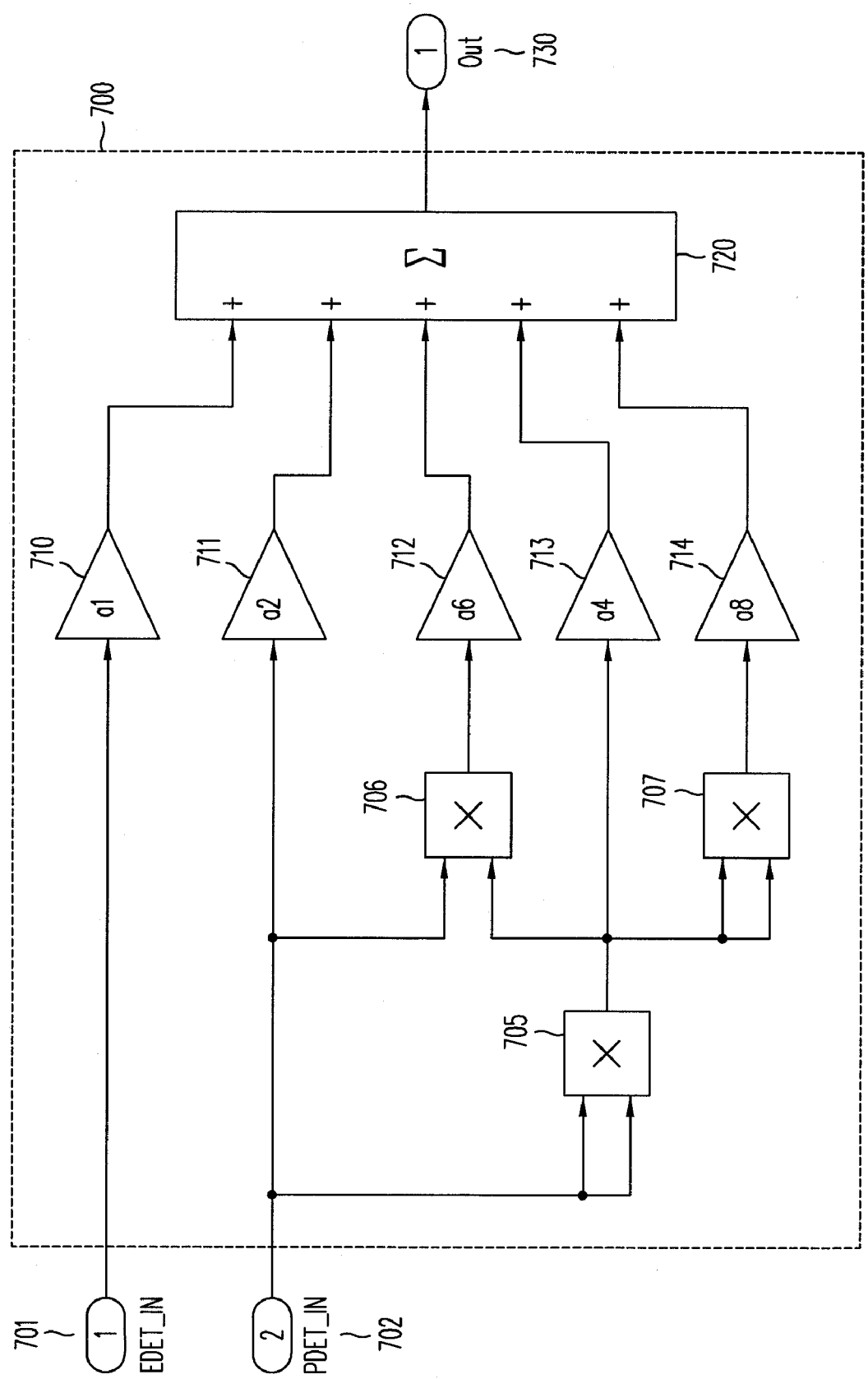
FIG. 7 shows a memoryless polynomial block described in FIG. 6.

FIG. 7 describes a memoryless polynomial circuit 700 which can be used to implement any of memoryless polynomial circuits 700a, 700b and 700c introduced in block 600 in FIG. 6. Circuit 700 is a memoryless polynomial circuit with multipliers 705-707, weights 710-714 and summer 720. Weights 710-714 are the coefficients in a coefficient vector from coefficient vector generator 117 (not shown), e.g., any of coefficient vectors 117a, 117b and 117c. Components of memoryless polynomial circuits 700 may be constructed with CMOS analog circuits. In one embodiment, the total number of coefficients in DCAS 116 is reduced so that polynomial terms for $r^{2l+1}(t)$ for $l \geq 1$ are eliminated. The first-order envelope term is important to the predistortion of some PAs and is always preserved.

Through experimentation and simulation, the Applicant has empirically discovered that the performance improvement obtained by preserving other odd-powered polynomial terms is negligible and thus the terms with $r^{2l+1}(t)$ for $l \geq 1$ have been eliminated from the implementation of memoryless polynomial 700. The first-order envelope term is important to the predistortion of some PAs and is preserved. Thus, the output at pin 730 can be expressed as shown in Equ. 7.

$$V(t)=a_1 r(t)+a_2 r^2(t)+a_4 r^4(t)+a_6 r^6(t)+a_8 r^8(t) \qquad \text{Equ. 7}$$

In addition to the first-order envelop term, the applicant has found that the terms where the envelop term is raised to a power greater than seven, such as, for example, $a_8 r^8(t)$, are also important to the predistortion of some PAs and may be preserved, as necessity dictates. In the general case, the time-varying signal, V(t), can be expressed and implemented according to the following equation:

$$V(t) = a_1 r(t) + \sum_{j=1}^{N} a_{2j} r^{2j}(t) \qquad \text{Equ. 8}$$

where r(t) is the envelop signal, N is a predetermined integer greater than or equal to 2, $r^{2j}(t)$ are exponentials of the envelop signal, and $a_{2j}$ are weights from the coefficient vector input signal.

Figure 8:
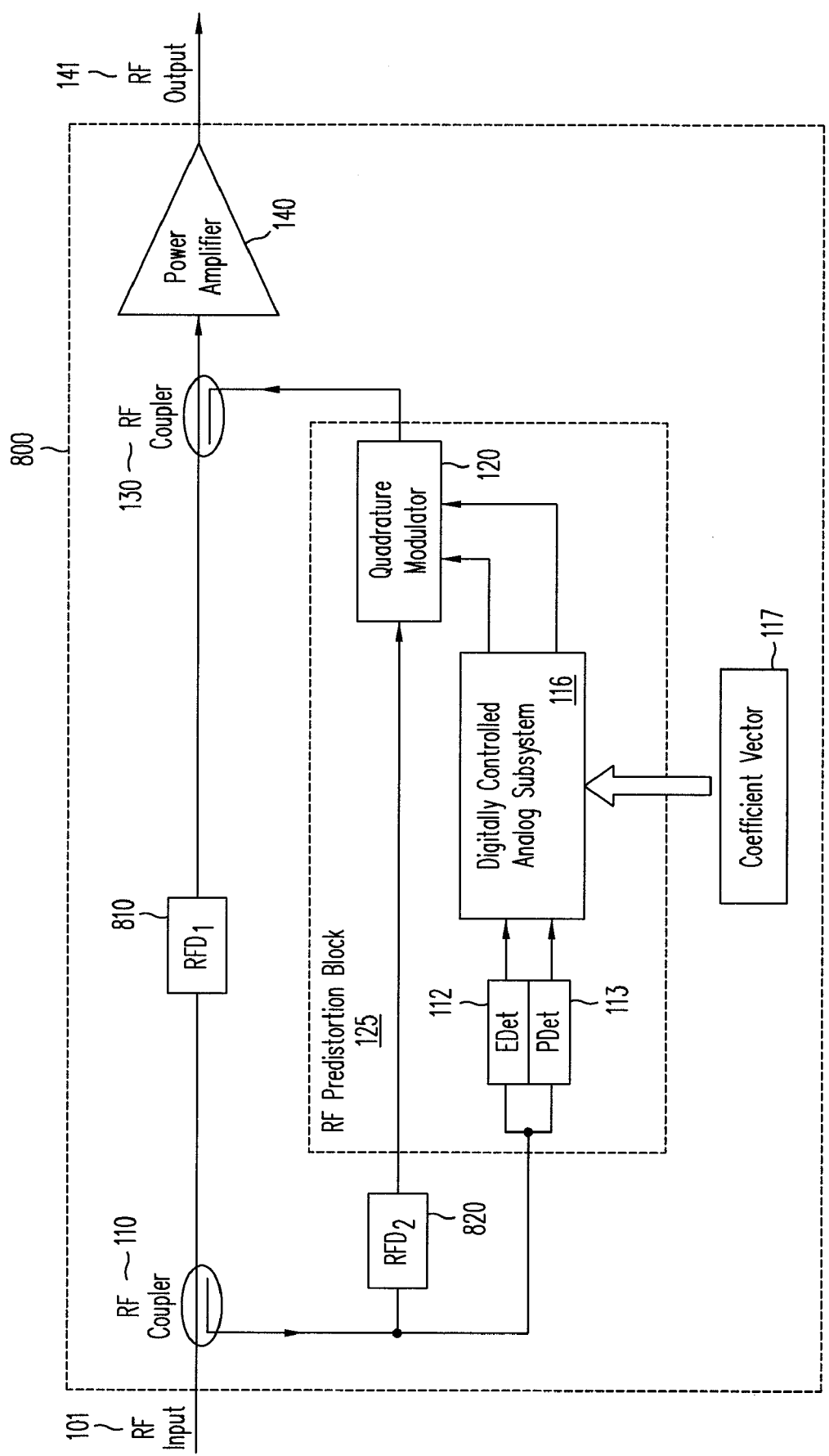
FIG. 8 shows a linear power amplifier with an analog RF predistortion block having off-chip delay elements.

In a second embodiment of a linear power amplifier, a linear PA 800 is shown in FIG. 8. In addition to the components of linear PA 100 of FIG. 4, linear PA 800 further comprises RF delay elements $RFD_1$ 810 and $RFD_2$ 820, where each delay is typically between 5 ns to 15 ns. If the RF predistortion block 125 is implemented as an integrated circuit, the memory compensation capability can be significantly improved by using off-chip RF delay elements $RFD_1$ 810 and $RFD_2$ 820 in the form of transmission lines. In one embodiment, $RFD_1$ 810 and $RFD_2$ 820 can each provide suitable transmission delays (e.g., 4 ns), such that the delayed terms in RF predistortion block 125 may provide non-causal (i.e., negative valued, relative the delays of $RFD_1$) predistortion terms.

Figure 9:
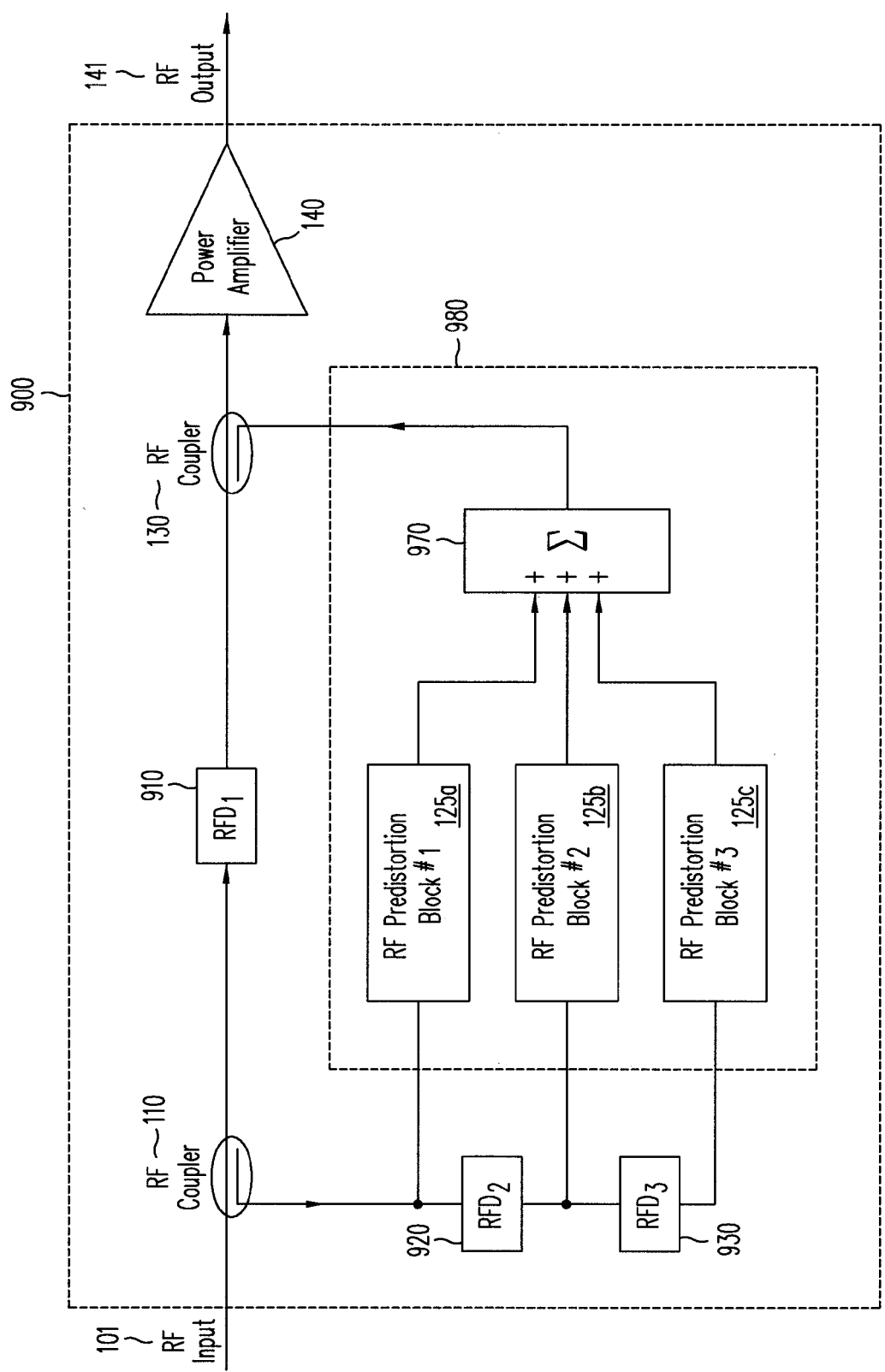
FIG. 9 shows a linear power amplifier with multiple analog RF predistortion blocks on a single integrated circuit.

In a third embodiment of a linear power amplifier, a linear PA 900 is shown in FIG. 9. Linear PA 900 employs at least three RF predistortion blocks 125a, 125b and 125c connected in parallel, as described in reference to FIG. 1. RF predistortion blocks 125a, 125b and 125c may all reside on a single chip integrated circuit 980. Linear PA 900 further comprises a combiner 970 connected to RF predistortion blocks 125a, 125b and 125c that sums together the signals emanating from the quadrature modulators in each block. Linear PA 900 further comprises RF delay elements 910, 920 and 930. RF delay elements 910, 920 and 930 delay the RF input 101 differently for each RF predistortion block 125a, 125b and 125c. Without limiting its application to other PA architectures, linear power amplifier 900 is suitable for high power Doherty amplifiers. Linear Amplifier 900, and variations based on the same principle, provides many options to fine tune the required predistortion to achieve a desired linear output profile.

Figure 10:
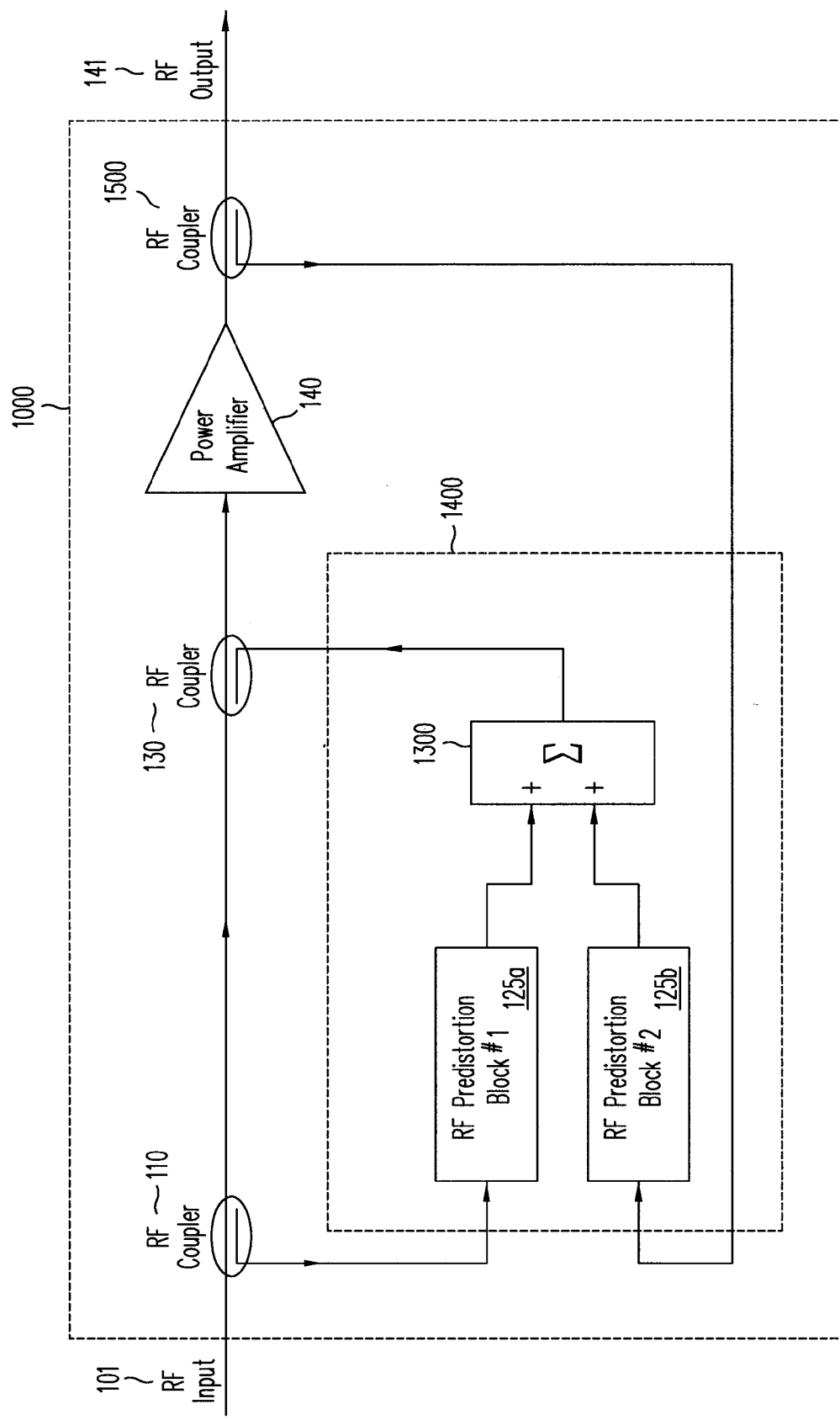
FIG. 10 shows a linear power amplifier with an analog RF predistortion block employing a feedback loop.

In a fourth embodiment of a linear power amplifier, a linear PA 1000 is shown in FIG. 10. Linear PA 1000 belongs to class of linear power amplifiers that employ adaptive predistortion using one or more feedback loops. Linear PA 1000 comprises at least two predistortion blocks 125a and 125b, as described in reference to FIG. 1. The at least two predistortion blocks 125a and 125b are connected in parallel and the output signals from these blocks are summed in summer 1300. Predistortion block 125b has a feedback signal returning from the output of PA 140 via coupler 1500 that is used for performance monitoring and coefficient adaptation. Predistortion blocks 125a and 125b and summer 1300 may be implemented on a single chip integrated circuit 1400.

Figure 11:
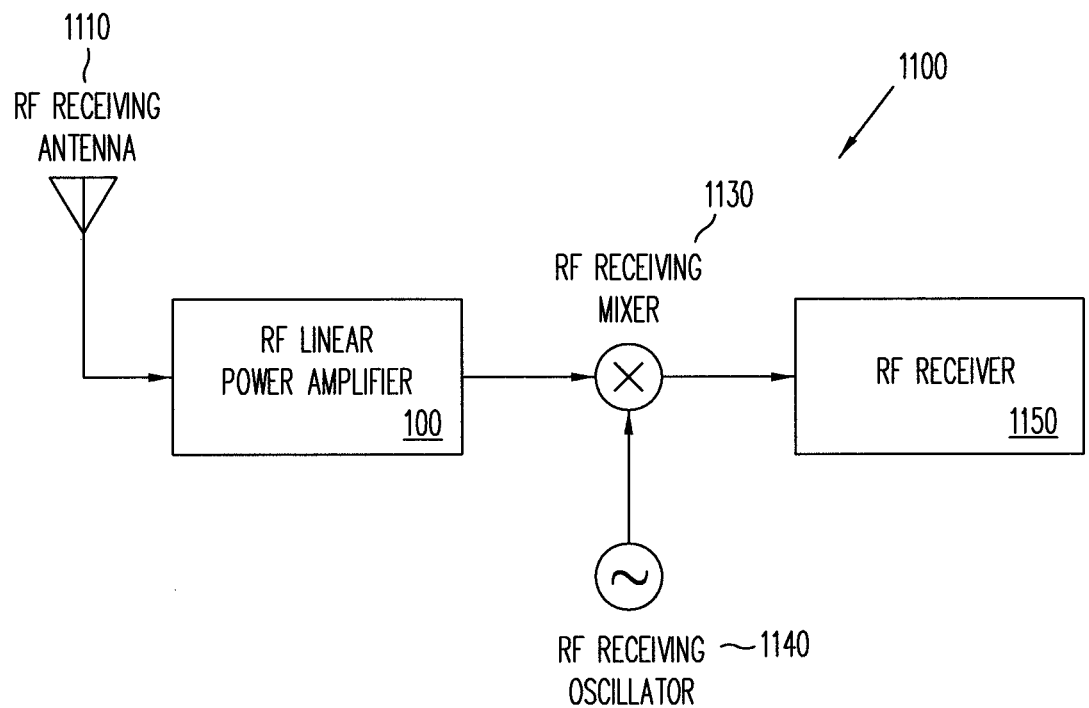
FIG. 11 shows a telecommunications system with a linear power amplifier used to receive RF signals.

FIG. 11 shows an embodiment of a telecommunications system 1100. System 1100 comprises an RF receiving antenna 1110, an RF linear power amplifier 100 as previously described herein, an RF receiving mixer 1130, an RF receiving oscillator 1140 and an RF receiver 1150.

Figure 12:
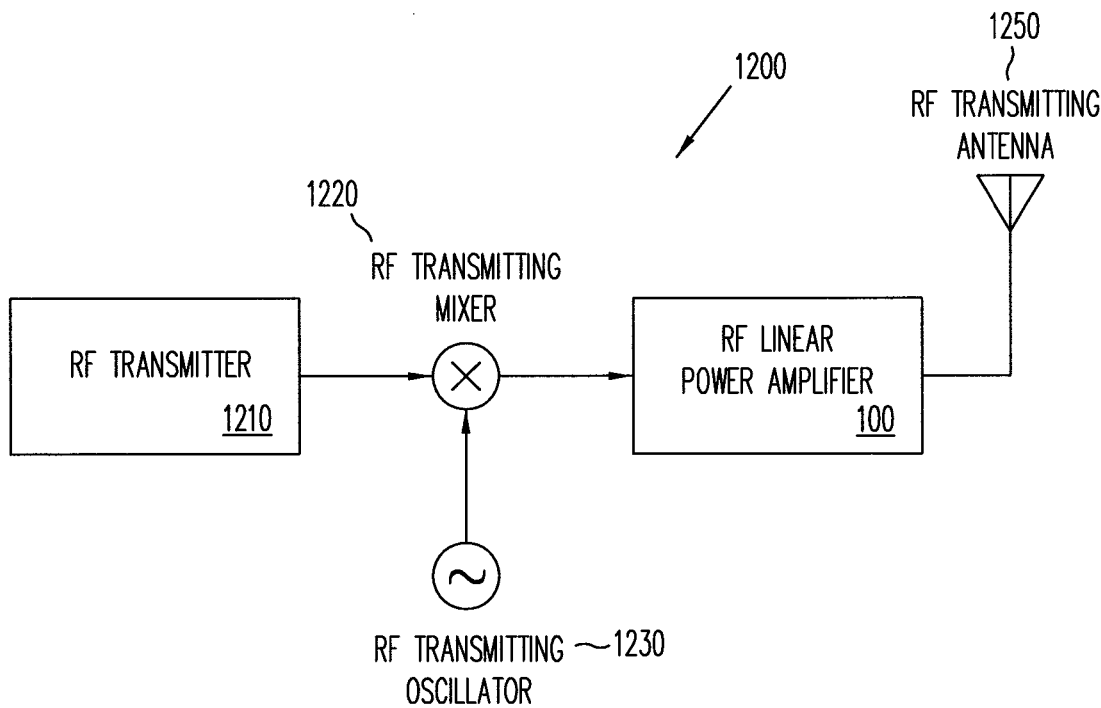
FIG. 12 shows a telecommunications system with a linear power amplifier used to transmit RF signals.

FIG. 12 shows an embodiment of a telecommunications system 1200. System 1200 comprises an RF transmitter 1210, an RF transmitting mixer 1220, an RF transmitting oscillator 1230, an RF linear power amplifier 100 as previously described herein and an RF transmitting antenna 1250.

The descriptions above are not intended to be exhaustive as to limit the invention to the precise form disclosed. It should be understood that the invention can be practiced with modification and alteration within its scope and that the invention be limited only by the claims and the equivalents thereof.

What is claimed is:

1. An RF predistortion apparatus comprising:
   an RF input line for carrying an RF signal;
   a coefficient vector input bus for carrying a coefficient vector comprising a plurality of coefficient signals each representing a coefficient;
   an RF predistortion processor, comprising:
   (a) a digitally controlled analog subsystem (DCAS) receiving an envelope signal representing a signal envelope of the RF signal and the coefficient vector; the DCAS generating first and second weight signals, $V_p(t)$ and $V_q(t)$, each representing a polynomial function of the RF input signal; and
   (b) a quadrature modulator coupled to the RF signal line and the DCAS to receive the RF input signal and the first and second weight signals, the quadrature modulator providing a predistortion signal representing a sum of in-phase and quadrature signals derived from the RF input signal, respectively weighted by the first and second weight signals; and
   an RF delay element coupled to the RF input line to provide a delayed RF input signal; an RF coupler coupling the predistortion signal and the delayed RF input signal to provide a predistorted input signal to a power amplifier.

2. The RF predistortion apparatus as in claim 1, wherein the predistortion processor further comprising an envelope detector coupled to the RF input line for providing the envelope signal.

3. The predistortion apparatus according to claim 2 wherein the envelope detector, the DCAS and the quadrature modulator reside on an integrated circuit.

4. The RF predistortion apparatus according to claim 2 wherein the envelope detector comprises a limiting amplifier, a current-mode Gilbert multiplier and a trans-impedance amplifier.

5. The RF predistortion apparatus according to claim 2 wherein the envelope detector is an approximate envelope detector followed by a soft limiting amplifier.

6. The RF predistortion apparatus according to claim 1, wherein the DCAS further receives a power signal representing the power of the RF signal.

7. The RF predistortion apparatus according to claim 6, further comprising a power detector providing the power signal, wherein the power detector comprises a current-mode Gilbert followed by a trans-impedance amplifier.

8. The RF predistortion apparatus according to claim 2 wherein the first and second weight signals, $V_p(t)$ and $V_q(t)$, are generated according to the following equations:

$$V_p(t) = \sum_{m=0}^{M-1} \sum_{k=1}^{K} a_{mk} r^m(t - \tau_k) \quad (1)$$

$$V_q(t) = \sum_{m=0}^{M-1} \sum_{k=1}^{K} b_{mk} r^m(t - \tau_k) \quad (2)$$

where $a_{mk}$ and $b_{mk}$ are polynomial coefficients from the coefficient vector, $\tau_k$ are delays from one or more memory delay circuits, M, K are integers, and r(t) is the envelope signal.

9. An RF predistortion apparatus according to claim 7 wherein the quadrature modulator outputs at least one time-varying signal, y(t), according to the following equation:

$$y(t) = V_p(t) r(t) \cos[2\pi f t + \phi(t)] + V_q(t) r(t) \sin[2\pi f t + \phi(t)] \quad (3)$$

where f is the frequency, r(t) is an envelope signal, and $\phi(t)$ is a phase of the RF input signal.

10. An RF predistortion apparatus according to claim 1 wherein the DCAS comprises memoryless polynomial circuits output at least one time-varying signal, V(t), according to the following equation:

$$V(t) = a_1 r(t) + \sum_{j=1}^{N} a_{2j} r^{2j}(t) \quad (4)$$

where r(t) is the envelop signal, N is a predetermined integer greater than or equal to 2, $r^{2j}(t)$ are exponentials of the envelope signal, and $a_l$ and $a_{2j}$ are weights from the coefficient vector input signal.

11. An RF predistortion apparatus as in claim 10 wherein the at least one time-varying signal, V(t), is implemented according to the following equation:

$$V(t) = a_1 r(t) + a_2 r^2(t) + a_4 r^4(t) + a_6 r^6(t) + a_8 r^8(t) \quad (5)$$

where r(t) is the envelope signal, $r^n(t)$ are exponentials of the envelop signal, and $a_n$ are weights from the coefficient vector input signal.

12. An RF predistortion apparatus as in claim 10, wherein N is greater than or equal to 4.

13. An RF predistortion apparatus as in claim 1, further comprising a second RF delay element coupled between the RF input signal line and the quadrature modulator, such that the RF input signal received into the quadrature modulator is delayed by the second RF delay element.

14. An RF predistortion apparatus as in claim 1, further comprising: a second predistortion processor substantially the same as the first predistortion processor providing a second predistortion signal; and a combiner combining the first and second predistortion signal providing a combined predistortion signal to the RF coupler.

15. An RF predistortion apparatus as in claim 14, wherein the second predistortion processor receives as an RF input signal an output signal of the power amplifier.

16. An RF predistortion apparatus as in claim 14, wherein the first and second predistortion processors are provided on the same integrated circuit.

17. A telecommunications system comprising an RF receiving antenna, an RF linear power amplifier, an RF receiving mixer, an RF receiving oscillator and an RF receiver; the RF linear power amplifier further comprising
- an RF input line for carrying an RF input signal connected to a power amplifier, a quadrature modulator, an envelope detector and a power detector; and
- a digitally controlled analog subsystem (DCAS) connected to an output of the envelope detector, an output of the power detector, and an output of a coefficient vector generator, wherein the DCAS has circuitry for processing the signals from the envelope detector, power detector and coefficient generator and wherein said circuitry selects one or more of coefficients from the coefficient vector generator and generates a weighted summation of the signals from the power detector and the envelope detector that are output to the quadrature modulator; and wherein the quadrature modulator has circuitry for mixing the DCAS output signals with the RF input signal to generate a signal output by the quadrature modulator that is connected to the RF input line for predistorting the RF input signal feeding the power amplifier.

18. A telecommunications system according to claim 17 further comprising an RF transmitter, an RF transmitting mixer, an RF transmitting oscillator and an RF transmitting antenna.

19. A linear power amplifier apparatus comprising:
- an RF input line for carrying an RF input signal connected to a power amplifier, a quadrature modulator, an envelope detector and a power detector; and
- a digitally controlled analog subsystem (DCAS) connected to an output of the envelope detector, an output of the power detector, and an output of a coefficient vector generator, wherein the DCAS has circuitry for processing the signals from the envelope detector, power detector and coefficient generator and wherein said circuitry selects one or more of coefficients from the coefficient vector generator and generates a weighted summation of the signals from the power detector and the envelope detector that are output to the quadrature modulator; and wherein the quadrature modulator has circuitry for mixing the DCAS output signals with the RF input signal to generate a signal output by the quadrature modulator that is connected to the RF input line for predistorting the RF input signal feeding the power amplifier.

20. A linear power amplifier according to claim 19 further comprising at least one RF coupler interposed between an output of the quadrature modulator and an input of the power amplifier.

21. A linear power amplifier according to claim 19 further comprising at least one RF delay element located in the RF input line to the power amplifier and at least one RF delay element located in the RF input line to the quadrature modulator.

22. A linear power amplifier according to claim 19 wherein the envelope detector, the power detector, the DCAS and the quadrature modulator reside on one or more integrated circuits.

* * * * *